United States Patent [19]

Smigelski

[11] 4,373,965
[45] Feb. 15, 1983

[54] SUPPRESSION OF PARASITIC SIDEWALL TRANSISTORS IN LOCOS STRUCTURES

[75] Inventor: Thomas S. Smigelski, Chicago, Ill.

[73] Assignee: NCR Corporation, Dayton, Ohio

[21] Appl. No.: 219,015

[22] Filed: Dec. 22, 1980

[51] Int. Cl.³ .................... H01L 21/302; H01L 21/26
[52] U.S. Cl. ........................................ 148/1.5; 29/571;
148/187; 156/649; 357/49; 357/52; 357/91
[58] Field of Search ................ 148/1.5, 187; 156/648, 156/649; 357/49, 52, 91; 29/571

[56] References Cited

U.S. PATENT DOCUMENTS

| | | | |
|---|---|---|---|
| 3,873,383 | 3/1975 | Kooi | 148/187 |
| 3,891,469 | 6/1975 | Moriyama et al. | 148/187 |
| 4,008,107 | 2/1977 | Hayasaka et al. | 148/175 |
| 4,101,344 | 7/1978 | Kooi et al. | 148/1.5 |
| 4,135,289 | 1/1979 | Brews et al. | 29/571 |
| 4,137,109 | 6/1979 | Aiken et al. | 148/175 |
| 4,182,636 | 1/1980 | Dennard et al. | 148/187 |

OTHER PUBLICATIONS

Appels et al., Philips Res. Repts. 26 (Jun. 1971), 157-165.
Esch, IBM-TDB, 21 (1978), 731.
Rideout et al., IBM-TDB, 17 (1974), 949.
"LOCOS Devices", *Philips Research Reports*, vol. 26, No. 3, Jun. 1971, pp. 166-180.

*Primary Examiner*—Upendra Roy
*Attorney, Agent, or Firm*—J. T. Cavender; Philip A. Dalton

[57] ABSTRACT

An improved process for eliminating parasitic sidewall transistor action associated with LOCOS isolation oxide structures. A combined oxide-nitride-oxide mask provides a large implant window and an underlying smaller oxidation window which is recessed about 1½ microns relative to the implant window. Implantation, followed by oxidation provides a recessed isolation oxide and a buried inversion-suppressing impurity layer which spans the length of the oxide, including the "bird's beak" region.

5 Claims, 11 Drawing Figures

IDEAL STRUCTURE
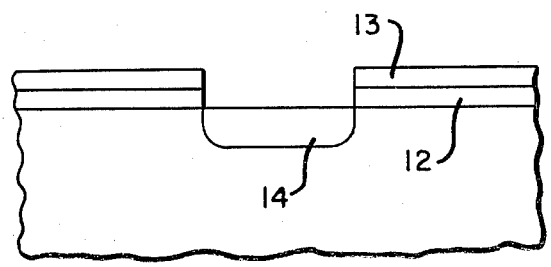
FIG. 2
CONVENTIONAL
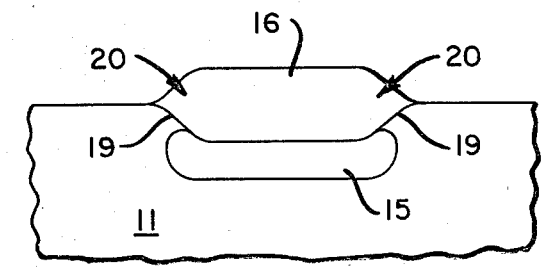
FIG. 3
CONVENTIONAL
FORM OXIDE, NITRIDE, AND THICK OXIDE LAYERS 22, 23, AND 27

MASK

ETCH

OVERETCH
AND
IMPLANT

OXIDATION

SUPPRESSION OF PARASITIC SIDEWALL TRANSISTORS IN LOCOS STRUCTURES

BACKGROUND OF THE INVENTION

The invention relates to the local oxidation of silicon (LOCOS) using silicon nitride masks, and to a method for controlling field inversion of LOCOS-produced oxide isolation regions.

LOCOS processing has gained wide acceptance in MOSFET technology. The advantages of LOCOS structures over planar structures include, insofar as thick oxide patterns are concerned, excellent definition of the thick oxide and smaller metalization steps (the LOCOS oxide beneath the metalization is at least partially recessed within the substrate).

Silicon nitride is widely used as an oxidation mask for LOCOS processing. Silicon nitride alone or, perhaps preferably, the composite silicon dioxide-silicon nitride is used as a thermal oxidation mask to form the recessed dioxide isolation islands which characterize LOCOS processing and structures. The recessed silicon dioxide not only provides electric isolation, but is also used to define adjacent substrate regions, such as active device regions. However, lateral growth of the oxide beneath the oxide-nitride composite mask can produce a laterally sloping oxide profile termed the "bird's beak", or a combination of this lateral beak and an upward-extending protuberance termed the "bird's head". See, e.g., Appels and Paffen, *Phillips Research Reports,* volume 26, number 3, June, 1971, pages 157–165 (hereafter, "Appels and Paffen"). These undesirable structures cause numerous problems.

First, the sloping "beak" may be undesirably removed during subsequent etching operations, thus exposing pn junctions, contact regions, and source and drain regions in the underlying substrate. Secondly, the sloping profile can cause ill-defined edges in adjacent regions and correspondingly ill-defined or varied electrical characteristics.

Referring to FIGS. 1–4, a third problem involves the formation of inversion-preventing impurity regions beneath the recessed oxide isolation islands. According to Appels and Paffen, the composite oxide-nitride mask can be used in a dual role—first as a diffusion mask and then as an oxidation mask—to form a diffusion region and the overlying isolation oxide island. Referring to the ideal situation depicted in FIG. 1, a buried impurity region 15I of substrate 11 is used to suppress unwanted inversion at the edges of the oxide island 16I. Ideally, the impurity region 15I encompasses the sidewalls 19I of the island 16I. Unfortunately, all too often this ideal situation does not occur.

Rather, and referring to FIG. 2, during formation of the oxide island and the underlying impurity layer, an impurity layer 14 is initially deposited within the substrate 11 using the composite oxide 12-nitride 13 LOCOS mask. As shown in FIG. 3, this impurity layer is expanded during oxidation and forms the inversion-suspending impurity layer 15. As is well known and as applicant has found during LOCOS processing, the impurity layer 15 typically does not expand laterally a sufficient distance to cover the sidewall 19 of the "bird's beak" 20. The exposed (inadequately implanted) substrate area increases as the thickness of the oxide mask 12 is increased and as the bird's beak is thus made increasingly long. The exposed substrate region beneath the side wall 19 is susceptible to being inverted by small voltages. The isolation oxide 16 circumscribes or borders active circuit areas such as transistors. At least some of the transistor channels are adjacent to and parallel to the exposed side walls. These exposed side walls provide low-threshold voltage, parasitic channels which are troublesome for memory as well as non-memory transistors. As shown in FIG. 11, for memory transistors the early turn-on effectively narrows the memory window between the erased (VTO) and written (VTI) states from $w_1$ and $w_2$.

SUMMARY OF THE INVENTION

The present invention relates to LOCOS processing, and more particularly to a process for providing an inversion-suppressing impurity layer encompassing the sidewalls of a LOCOS oxide island, including the elongated edges or "bird's beak" of the oxide. Initially, silicon dioxide and then silicon nitride oxidation masking layers are formed on the device substrate. The combined thickness of the oxide and nitride layers is sufficient to permit ion implantation through the layers into the substrate. A thick, implant-masking oxide layer is formed over the nitride layer. Then, a first, relatively small oxidation window is formed in the nitride layer. A second, relatively large implant window is then formed in the thick oxide, leaving the smaller, oxidation window in the nitride layer. Next, the structure is subjected to ion implantation to form a substrate impurity region which corresponds to the relatively large window. The substrate is then oxidized via the relatively small window for a sufficient time to form a thick isolation oxide layer.

The relative dimensions of the nitride and oxide windows are tailored so that the implant applied through the relatively wide oxide window completely covers the underside of the isolation oxide, including the sidewalls and the beak region thereof. The implant suppresses unwanted inversion of the substrate region beneath the oxide sidewalls.

The invention is especially effective for, and is intended for use in, the prevention of parasitic channels formed beneath the elongated side regions of LOCOS isolation oxides.

BRIEF DESCRIPTION OF THE DRAWINGS

FIGS. 2 and 3 are cross-sectional schematic representations of the process of forming the actual structure corresponding to the idealized version shown in FIG. 1;

DETAILED DESCRIPTION

Figure 1:
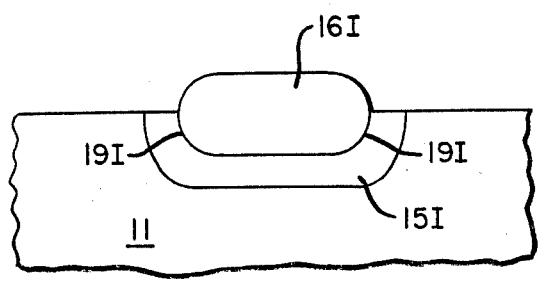
FIG. 1 is a cross sectional view of an ideal isolation oxide-inversion suppressing impurity layer.
Figure 4:
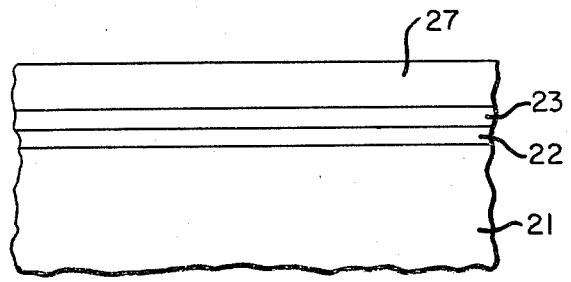
FIGS. 4 through 8 are cross-sectional representations illustrating the crucial steps of applicant's improved LOCOS process.
Figure 7:
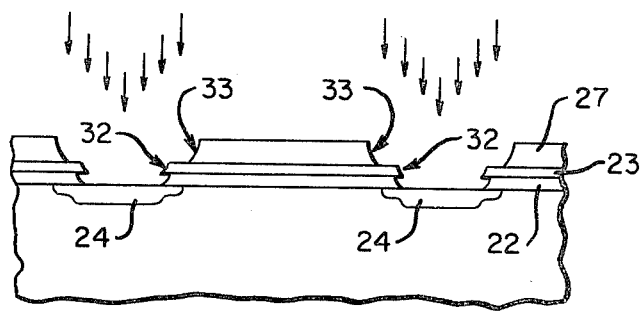
Figure 8:
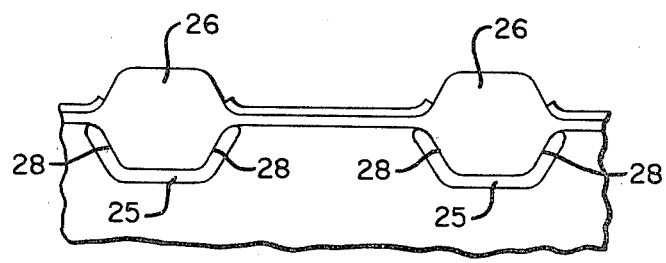

Referring to FIG. 4, initially in employing the present invention, a silicon dioxide layer 22, a silicon nitride layer 23, and a relatively thick silicon dioxide layer 27 are formed on substrate 21. Typically, the substrate 21 is silicon; the first (relatively thin) silicon dioxide layer 22 is grown by thermal oxidation of the substrate; the relatively thin silicon nitride layer 23 is deposited by conventional CVD (chemical vapor deposition) techniques; and the second, thick silicon dioxide layer 27 is also deposited by CVD techniques. The combined thickness of the silicon dioxide layer 22 and the silicon nitride layer 23 is chosen to be permeable to the ion implanatation (FIG. 7) which forms the inversion-suppression impurity region 25 (FIG. 8). The thickness of the second, thick oxide layer 27 is sufficient to effectively mask the substrate during this implantation.

Suitable, but certainly not exclusive thicknesses for the layers 22, 23 and 27 are approximately 550, 700 and 5,000 Angstroms (0.055, 0.07, and 0.5 microns).

Figure 5:
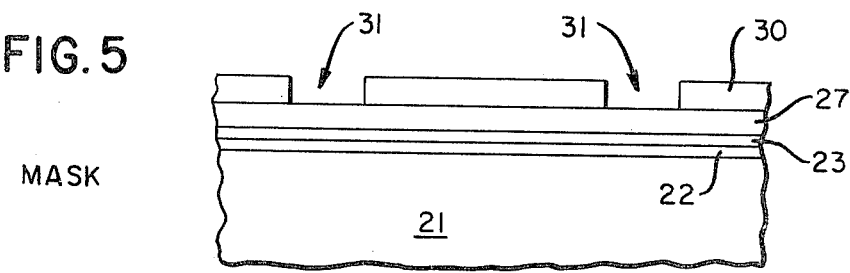

Next, referring to FIG. 5, standard photolithographic techniques are applied to form a mask 30 having windows 31 for defining the location of the oxide isolation islands 26-26 (FIG. 8).

Figure 6:
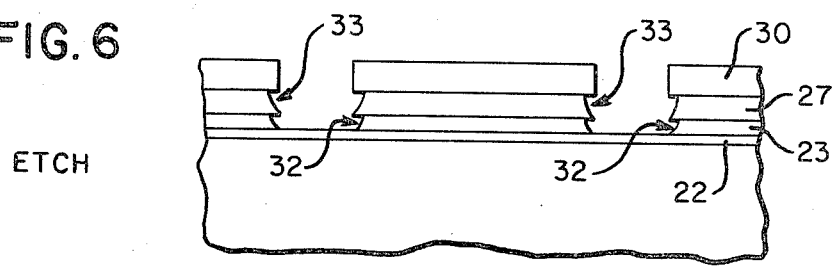

Referring to FIG. 6, the thick silicon dioxide layer 27 and the silicon nitride layer 23 are then etched in the presence of the mask 30 to define respective windows 33 and 32 therein. This is readily accomplished by sequential application of selective etchants, such as buffered hydrofluoric (HF) acid for the oxide followed by a plasma etch for the nitride.

Those skilled in the art will appreciate that other formation techniques are available. For example, non-contact procedures may be used to form the apertures 32 and 33, techniques such as plasma etching may be used in place of wet chemical etching, and newly emerging techniques such as X-ray and electron beam lithography may be applied.

The nitride windows 32 are used to establish the lateral dimensions and positioning of the subsequently-formed thermal isolation oxide 26 (FIG. 8). Referring to FIG. 7, prior to the growth of this oxide 26, the thick oxide windows 33 are enlarged laterally to define relatively large implant windows for the substrate. Here, again, a selective etchant such as buffered HF is conveniently used. Buffered HF removes silicon dioxide at the rate of about 600 Angstroms (0.06 microns) per minute and removes silicon nitride at the much lower rate of about 60 Angstroms (0.006 microns) per minute. As a result, there is controlled removal of the oxide 27 and enlargement of the oxide implant windows 33 with very little alteration of the dimensions of nitride oxidation windows 32.

It should be noted that during the enlargement of the oxide mask 33, the thin oxide layer 22 is etched and the etched region extends laterally beyond the thick oxide layer window 33. However, this enlargement of the oxide window is minimal. In any event, the only effect of the slightly enlarged oxide window is a small and controllable increase in the substrate area which is exposed to subsequent oxidation.

Referring further to FIG. 7, photoresist mask 30 is stripped and the impurity regions 24—24 are implanted via oxide windows 33 using impurities of the same conductivity type as the substrate. As mentioned previously, the thicknesses of the oxide layer 22 and the nitride layer 23 are selected so that these layers do not mask the substrate during implantation. Consequently, the lateral outlines of the impurity regions 24 coincide with those of the relatively wide oxide mask windows 33. After inplantation, the oxide mask 27 may be removed using buffered hydrofluoric acid.

Next, oxide isolation islands 26 are formed within the substrate 21 as shown in FIG. 8. One suitable technique is wet thermal oxidation. The width and position of the oxide layers 26 are defined by the relatively small nitride mask windows 32 such that the resulting inversion-suppressing impurity regions 25 encompass the underside of the oxide 26, including the sidewalls 28 thereof. It is estimated that for most applications the edge or periphery of an oxide mask window 33 should extend about one to two microns beyond (outside) the corresponding edge or periphery of the nitride window 32 to provide adequate coverage of the sidewalls 28—28 by the implant 25. This dimension will vary depending upon the dimensions (and oxidation conditions) for oxide layers 26 and the concentration profile of the deposited layers 24. Those skilled in the art will readily achieve the optimum window dimensions for the particular process they are using.

Figure 9:
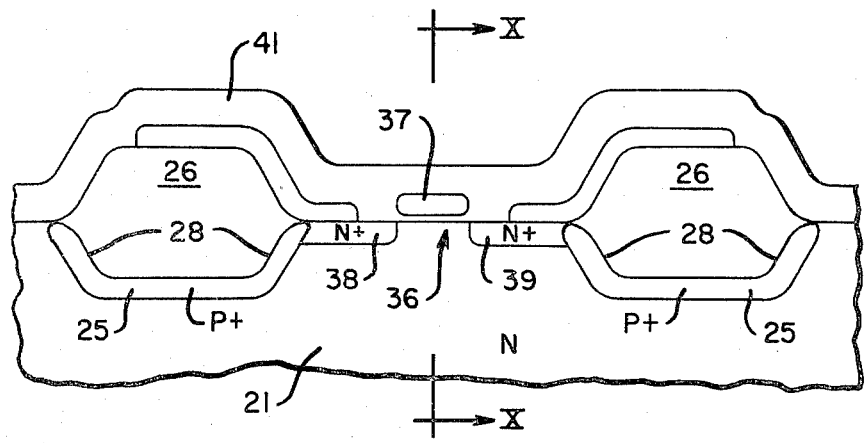
FIGS. 9 and 10 are mutually orthogonal cross sectional representations illustrating the improved MOSFET isolation resulting from the application of applicant's process.
Figure 10:
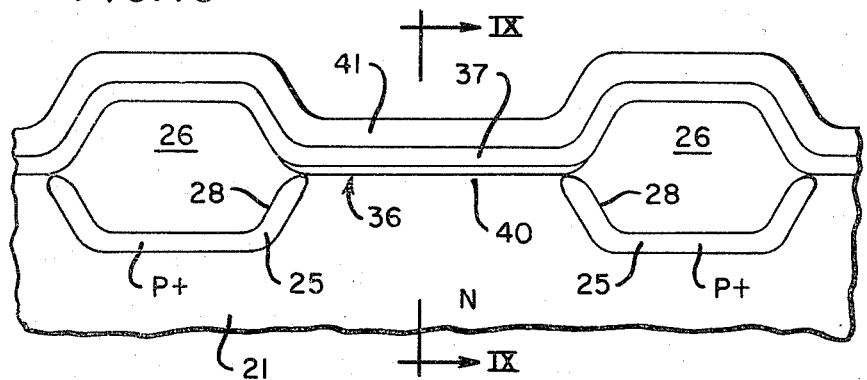

Various approaches are suitable for completing the oxide-isolated structure shown in FIGS. 9 and 10 from the structure shown in FIG. 8. For example, after the FIG. 8 LOCOS oxidation, the oxide layer 22 and the nitride layer 23 can be removed and a gate dielectric 36 and conductive gate 37 formed. Typically the gate dielectric 36 of memory devices comprises silicon oxide layer 36A and silicon nitride layer 36B. The gate, typically polysilicon here, is then used as a mask during self-aligned formation of the source 38 and drain 39 by furnace diffusion or implantation.

Alternatively, the oxide layer 22 and nitride layer 23 can be formed to the appropriate dimensions and location for use as a gate mask during formation of the source and drain. Then, after removal of the oxide 22 and nitride 23, gate dielectric 36 and gate 37 are formed. Typically, this alternative procedure would be used for metal gate devices.

After formation of the gate, source, and drain, a thick oxide layer 41 is then deposited over the device, contact cuts (not shown) are made, and conductors (not shown) are applied to this source, drain and gate. Finally, passivation layer(s) 49 may be formed over the circuit.

Those skilled in the art will appreciate that the isolation oxide 26 and the impurity region 25 circumscribe the transistor shown in FIGS. 9 and 10. The impurity region 25 prevents unwanted inversion of the substrate regions beneath the oxide sidewalls 28. As shown in FIG. 10, this includes preventing the formation of parasitic conduction paths under the oxide sidewalls 28 which are parallel to the transistor channel.

EXAMPLES

Several polysilicon gate devices were prepared using the above process parameters and the following specific parameters. Other devices were prepared in precisely the same way except that oxide layer 27, the oxide window 33 and the oxide window enlargement step (FIG. 7) were not used.

The substrates 21 were p-type, 15 to 21 ohm-cm, <100> silicon. Oxide layer 22 was formed to a thickness of 550 Angstroms using dry $O_2$ thermal oxidation at 1000° C. Nitride layer 23 was formed to a thickness of 690 Angstroms using low pressure chemical vapor deposition of dichlorosilane and ammonia at 750° c. The thick oxide layer 27 was deposited on selected ones of the devices to a thickness of 5000 Angstroms using sulane and oxygen at 600° C. The initial oxide windows (FIG. 6) were formed to a width of about six microns using a buffered hydrofluoric acid etchant. Then, the nitride windows 32 were formed to a width of six microns using hot phosphoric acid etchant. The oxide windows of the selected devices were enlarged to the windows 33 (FIG. 7) of eight to nine microns width centered over the nitride windows 32. Next, boron impurity layers 24 were implanted via the nitride windows 32 using 60 keV and a dose of $8 \times 10^{13}$ ions/cm$^2$. Thick oxide layers 26 were grown to about 1½ microns thickness using wet thermal oxidation at 975° C. for 780 minutes. A memory gate oxide 36A of 20 Angstroms thickness was formed by dry O$_2$ thermal oxidation at 750° C., a gate nitride layer 36B of 380 Angstroms thickness was formed over the oxide 36A by low pressure chemical vapor deposition, a polysilicon gate 37 of 5000 Angstroms thickness was formed by low pressure chemical vapor deposition of silane at 625° C., and n-type source 38 and drain 39 were formed by diffusion using the polysilicon gate as a mask. Finally, oxide layer 41 was formed, contact cuts were made, and aluminum contacts were applied to the source, drain, and gate.

Figure 11:
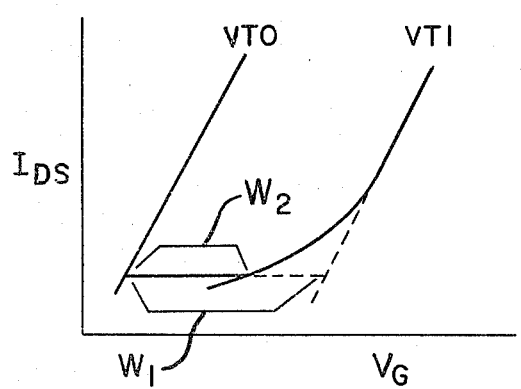
FIG. 11 is a graph of I vs D characteristics for conventional memory transistors ($W_2$) and memory transistors fabricated using the present invention ($W_1$).

The devices constructed according to the present invention exhibited a large memory window $w_1$ (FIG. 11) of about 4.5 volts between VT0 and VT1. The conventional devices (prepared in the same way but without the oxide 27 and oxide window enlargement procedure) exhibited a relatively small memory window W$_2$ (FIG. 10) of about 2.5 volts. The threshold voltages for both types of devices were measured at drain-source currents, I$_{DS}$, of 10 nanoamperes.

Thus, there has been described a process for substantially overcoming the parasitic conduction associated with the sloping oxide sidewalls of LOCOS structures.

I claim:

1. An improved process for forming, in a substrate, a recessed isolation oxide layer and a buried impurity layer beneath the oxide layer, comprising:
    forming a mask structure having a first, oxidation window and a second, implant window overlying the first window, the second window being wider than the first window for controlling the formation of the impurity layer such that the impurity layer spans the underside of the edge of the isolation oxide layer;
    forming the impurity layer by implanting the substrate via the second window; and
    forming the isolation oxide layer by oxidizing the substrate via the first window.

2. An improved process for forming in a substrate a recessed isolation oxide and a buried impurity layer beneath the oxide layer which spans the underside of the oxide layer, comprising:
    forming, in order, on the substrate a first, relatively thin silicon oxide layer, a silicon nitride layer, and a second, relatively thick silicon oxide layer; the second oxide layer being sufficiently thick to mask the substrate during ion implantation;
    forming a first window through the oxide layers and the nitride layer;
    enlarging the portion of the first window in the second oxide layer to form a second window, at least one edge of the second window lying at least about 1-2 microns outside the corresponding edge of the first window;
    implanting the substrate via the second window; and
    oxidizing the substrate in the presence of the first oxide layer and the nitride layer to form an isolation oxide layer over the impurity layer.

3. A process for forming in a substrate a recessed isolation oxide and a buried impurity layer which spans the length of the oxide, comprising:
    forming, in order, on the substrate a first, relatively thin silicon oxide layer, a silicon nitride layer, and a second, relatively thick silicon oxide layer; the second oxide layer being sufficiently thick to mask the substrate during ion implantation;
    forming a first window through the second oxide layer and the nitride layer by selectively etching the second oxide layer, then the nitride layer;
    selectively overetching the portion of the first window formed in the second oxide layer to form a second window in the second oxide layer, overlying the first window, the periphery of the second window being spaced at least about 1-2 microns outside the periphery of the first window;
    implanting the substrate via the second window to form the buried impurity layer; and
    oxidizing the substrate via the first window to form the isolation oxide layer over the impurity layer, the impurity layer spanning the underside of the isolation oxide layer.

4. A process for forming an improved LOCOS isolation structure in a semiconductor substrate, comprising:
    oxidizing the substrate to form a first oxide layer thereon;
    depositing a nitride layer on the first oxide layer;
    depositing a second, relatively thick, implant-masking oxide layer over the nitride layer;
    forming a first window in the nitride layer by selectively etching the second oxide layer, then selectively etching the nitride layer;
    selectively etching the second oxide layer to form a second window, overlying the first window, in the second oxide layer, the edges of the second window being spaced laterally about 1½ microns outside corresponding edges of the first window;
    implanting the substrate via the second window to form an impurity layer therein, the effective edges of the impurity layer being controlled by the second window and extending laterally past the edges of the first window; and
    oxidizing the substrate via the first window to form over the impurity layer an at-least-partially recessed oxide layer having sloping side walls, the spaced edges of the first and second masks causing the recessed oxide layer and the impurity layer, to be formed with the impurity layer spanning the side walls of the recessed oxide layer.

5. The process of claims 2, 3 or 4 wherein the first oxide layer, the nitride layer, and the second oxide layer are formed to respective thicknesses of about 0.05, 0.07, and 0.5 microns.

* * * * *